United States Patent
Sumnitsch

Patent Number: 5,845,662
Date of Patent: Dec. 8, 1998

[54] DEVICE FOR TREATMENT OF WAFER-SHAPED ARTICLES, ESPECIALLY SILICON WAFERS

[76] Inventor: Franz Sumnitsch, Universitatsstrasse 25, A-9020 Klagenfurt (Karnten), Austria

[21] Appl. No.: 750,504
[22] PCT Filed: Feb. 28, 1996
[86] PCT No.: PCT/AT96/00034
§ 371 Date: Dec. 11, 1996
§ 102(e) Date: Dec. 11, 1996
[87] PCT Pub. No.: WO96/35227
PCT Pub. Date: Nov. 7, 1996

[30] Foreign Application Priority Data
May 2, 1995 [AT] Austria ......................................... 753/95

[51] Int. Cl.⁶ ..................................................... B08B 3/02
[52] U.S. Cl. ........................... 134/153; 118/52; 118/503; 134/902
[58] Field of Search .................................... 134/902, 153; 118/52, 503; 269/902, 903, 909, 57

[56] References Cited

U.S. PATENT DOCUMENTS

| | | | |
|---|---|---|---|
| 4,788,994 | 12/1988 | Shinbara | 134/153 X |
| 4,903,717 | 2/1990 | Sumnitsch | 134/153 X |
| 5,168,886 | 12/1992 | Thompson et al. | 134/153 |

FOREIGN PATENT DOCUMENTS

| | | |
|---|---|---|
| 0 402 900 | 12/1990 | European Pat. Off. . |
| 0 444 714 | 9/1991 | European Pat. Off. . |
| 0 635 872 | 1/1995 | European Pat. Off. . |
| 298 529 | 2/1992 | Germany . |
| 42 32 902 | 3/1994 | Germany . |
| 213827 | 8/1992 | Japan ..................................... 134/902 |
| 684 602 | 10/1994 | Switzerland . |
| WO 96/35227 | 11/1996 | WIPO . |

OTHER PUBLICATIONS

IBM Technical Disclosure Bulletin, vol. 18, No. 8 "Spin Basket", Censak et al., pp. 2476–7 Jan. 1976.

*Primary Examiner*—Philip R. Coe
*Attorney, Agent, or Firm*—Young & Thompson

[57] ABSTRACT

In chamber (1) a basket which is formed by ring (3) and retaining fingers (4) is pivotally mounted. By turning the basket, wafer-shaped article (7) which is held by retaining fingers (4) at an axial distance from ring (3) is caused to rotate. Nozzle (10 and 11) from which a treatment fluid can be applied to article (7) is assigned both to upper and lower large surface (9) of article (7).

32 Claims, 7 Drawing Sheets

DEVICE FOR TREATMENT OF WAFER-SHAPED ARTICLES, ESPECIALLY SILICON WAFERS

BACKGROUND OF THE INVENTION

The invention relates to a device for treatment of wafer-shaped articles, especially silicon wafers, with a treatment fluid with a rotary mounting located in a chamber for the wafer-shaped article and with at least one nozzle for applying the treatment fluid to the wafer-shaped article.

DESCRIPTION OF THE RELATED ART

For holding of wafer-shaped articles, especially silicon wafers, devices have become known in the most varied versions.

In addition to carriers for silicon wafers which operate according to the Bernoulli principle (see for example EP 0 316 296 A and EP 0 444 714 A), from DE 42 32 902 A1 a mount for transport of flat, round wafer-shaped substrates has become known which has elastic retaining fingers which are located in the plane of tension members of transport tongs. The device known from DE 42 32 902 A1 however is used solely for transportation of round wafer-shaped articles in a vacuum process unit.

A carrier for semiconductor wafers with retaining parts which engage the outer periphery of silicon wafers is known from U.S. Pat. No. 5,168,886 A. Using this carrier the semiconductor wafers can also be caused to rotate. In any case, in the carrier known from U.S. Pat. No. 5,168,886 A only one side of the semiconductor wafer is ever accessible to a treatment process.

SUMMARY OF THE INVENTION

The object of the invention is to devise a device of the initially mentioned type with which the two sides of the wafer-shaped article are accessible to a treatment process.

According to the invention this object is achieved by the mounting for the wafer-shaped article having a ring which is pivotally mounted in the device around an axis and by there being several retaining fingers on the ring which adjoin the outer periphery of the wafer-shaped article, the ends of the retaining fingers which adjoin the outer periphery of the wafer-shaped article being located at a distance from the plane of the ring.

In the device according to the invention not only are the two sides of the wafer-shaped article (silicon wafer) accessible to a treatment process, but it is also advantageous that the wafer-shaped article is located at an axial distance from the pivotally mounted and rotary-driven ring because the treatment fluid flung off the wafer-shaped article does not come into contact with the rotary ring and its bearing so that they are not adversely affected by the treatment fluid, for example, corroded.

Advantageous and preferred embodiments of the device according to the invention comprise the subject matter of the subclaims.

BRIEF DESCRIPTION OF THE DRAWINGS

Other details and features as well as the advantages of the device according to the invention follow from the following description of embodiments of the invention in which reference is made to the attached drawings, in which exemplary embodiments are shown as much as possible in schematic form.

DESCRIPTION OF THE PREFERRED EMBODIMENTS

In chamber 1 ring 3 is pivotally mounted in bearing 2. Ring 3 can be caused to rotate at high speed by a drive which is symbolized by drive roller 3' which engages ring 3. Chamber 1 can be made closed, as is shown by way of example in FIG. 1, in which a closing element, for example flap 16', can be assigned to one suction channel 16 or each suction channel 16, if suction channels 16 are provided.

Figure 1:
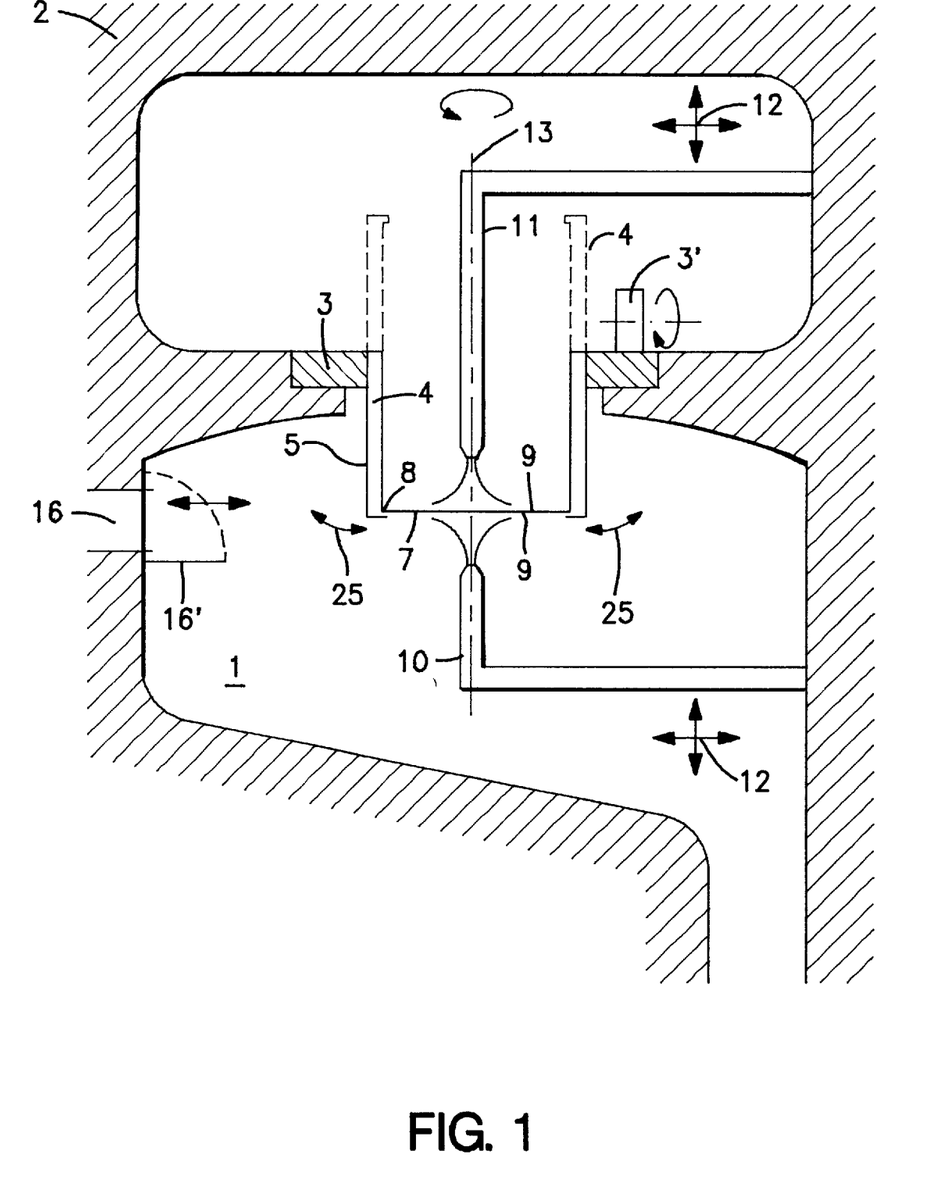
FIG. 1 shows in schematic form and in axial cross section a first embodiment of a device for treating wafer-shaped articles.

On the inside edge of ring 3 are several (at least three, however up to twelve) retaining fingers 4 which project downward from ring 3 in the embodiment shown. Free ends 5 of retaining finger 4 are angled and adjoin outside edge 8 of wafer-shaped article 7.

Although it is not essential, the arrangement can be such that retaining fingers 4 adjoin outside periphery 8 of wafer-shaped article 7 in a spring-elastic manner. For this reason retaining fingers 4 can be made at least partially spring-elastic. However it is also possible to swivel-mount retaining fingers 4 on ring 3 (the swivel axis of each retaining finger lies in a plane parallel to the plane of ring 3 and is aligned tangentially to ring 3), retaining fingers 4 being held in the position which adjoins the outer periphery 8 of wafer-shaped article 7 by one or several springs (in the latter case one spring is assigned to each retaining finger). Alternatively or additionally a measure can be provided to fix retaining fingers 4 in the position which adjoins outer periphery 8 of wafer-shaped article 7 in order that they do not move to the outside due to centrifugal forces. Exemplary embodiments for retaining fingers 4 are shown in FIGS. 3 through 7.

It is shown schematically in FIG. 1 that retaining fingers 4 of ring 3 can also point upward so that wafer-shaped article 7 is held above ring 3.

Although basically there can be only one nozzle for applying a treatment liquid (acid for etching and/or washing liquid for flushing the silicon wafer), in the exemplary embodiment shown there are two nozzles 10 and 11, of which each is assigned to one of large surfaces 9 of wafer-shaped article 7.

It can be recognized that due to the special formation of ring 3 and retaining fingers 4 which form a basket, both the top and the bottom, therefore two large surfaces 9 of wafer-shaped article 7 are freely accessible to treatment with treatment liquid.

In one preferred embodiment nozzles 10, 11, as symbolized by double arrows 12 in FIG. 1, can be adjusted relative to wafer- shaped article 7. Adjustability can be achieved by the mounting (not shown) of nozzles 10 and 11 being swivelled around an axis which is parallel to axis of rotation 13 of the basket (ring 3 and retaining fingers 4), but which has a distance from it. In addition or alternatively the mounting can also be executed such that it adjusts nozzles 10 and 11 such that they move along one diameter of wafer-shaped article 7.

It is further recognizable from FIG. 1 that treatment fluid flung off the wafer-shaped article can be captured in chamber 1 without adversely affecting ring 3 and its support 2 and can be disposed of from the chamber via discharge 14.

Free ends 5 of retaining fingers 4 which preferably independently of one another can be placed against outer periphery 8 of wafer-shaped article 7 (in order to equalize the peripheral contours of the wafer-shaped article which deviate from an exact circular shape), instead of angled ends 5 can also have for example V-shaped recesses into which edge 8 of wafer-shaped article 7 fits. This embodiment is also suitable for retaining rings 4 which point upward from ring 3.

Figure 2:
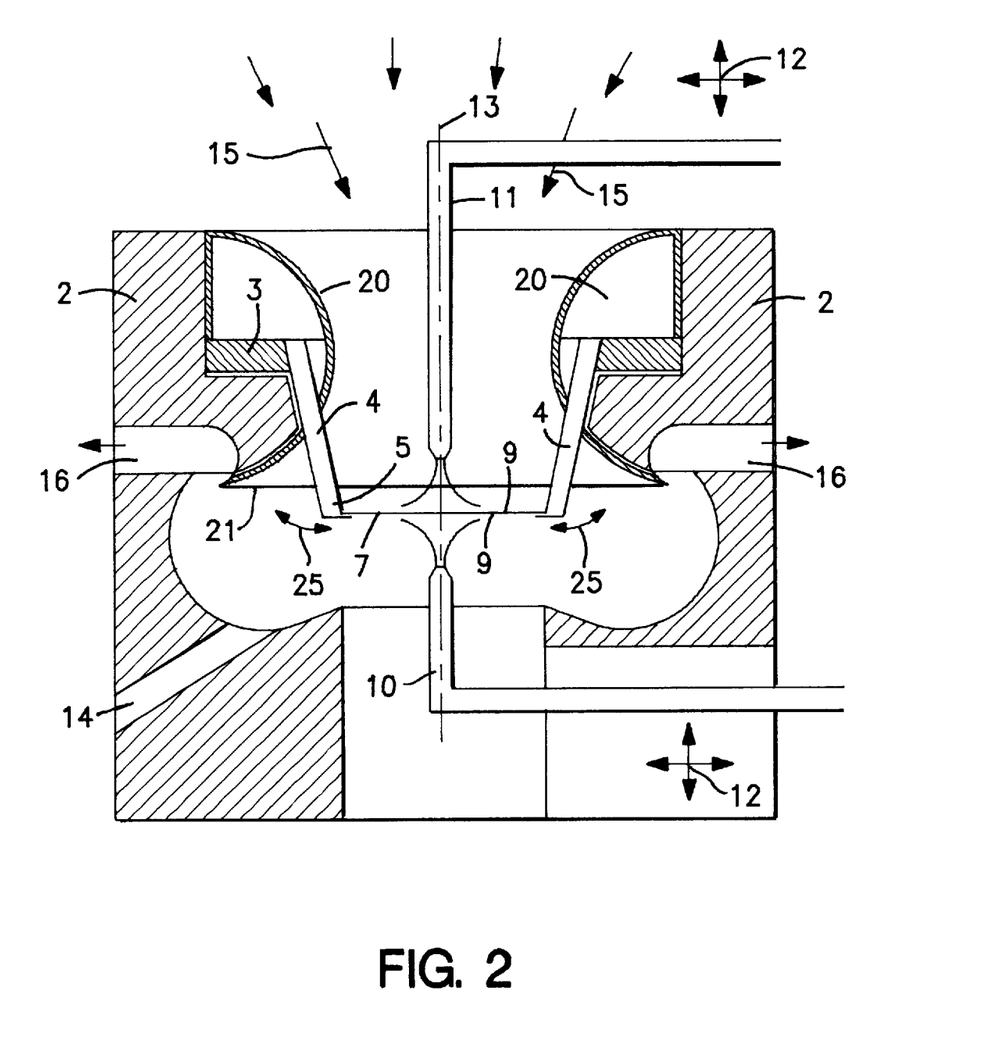
FIG. 2 shows in schematic form and in cross section a second embodiment of the device for treating wafer-shaped articles.

In the embodiment of the device according to the invention shown in FIG. 2 for treatment of wafer-shaped articles ring 3 is protected radially to the inside by toroidal lining 20 so that treatment fluid which may have swirled cannot reach ring 3 and its support in bearing 2.

Lower free end 21 of lining 20 is located above article 7 to be treated, but is positioned under suction channels 16 through which the air or nitrogen supplied in the direction of arrows 15 can be withdrawn again.

Figure 3:
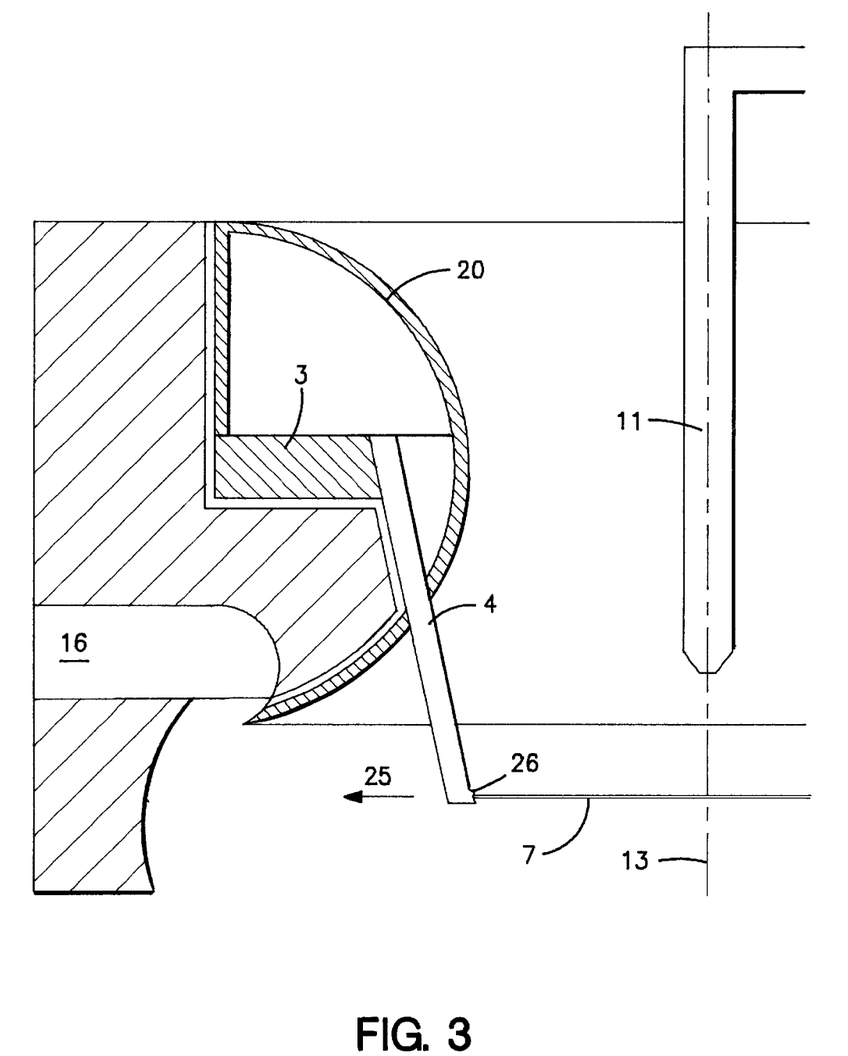
FIG. 3 shows one embodiment of the retaining fingers on an enlarged scale.

In the embodiment shown in FIG. 3, at least three retaining fingers 4 which are attached to ring 3 are positioned obliquely to axis 13 so that they run onto one another from top to bottom. Fingers 4 of the various embodiments (FIGS. 1–3, 6 and 7) themselves are made elastic so that they can flex radially to the outside in the direction of arrow 25 when wafer-shaped article 7 is inserted, for example using a manipulator and then under their spring force line up against the outside edge of wafer-shaped article 7. To place the wafer-shaped article securely on the free end of retaining fingers 4, on the free ends of retaining fingers 4 are V-shaped recesses 26 which are open to the inside, in which the outside edge of wafer-shaped article 7 is held.

Figure 4:
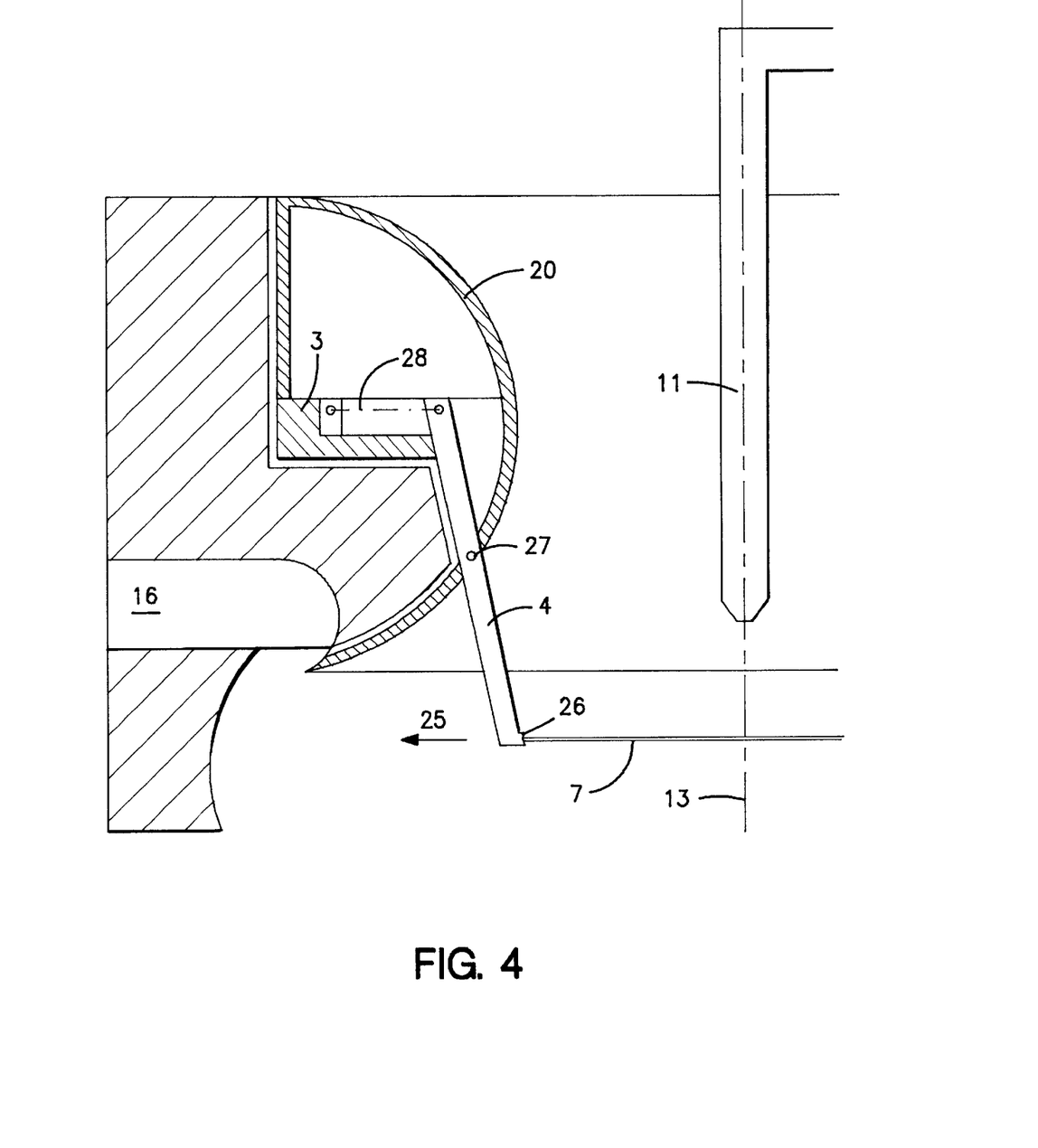
FIG. 4 shows one embodiment with swivelling retaining finger.

In the embodiment shown in FIG. 4 retaining fingers 4 are swivel-mounted around bearing 27 which is provided for example on lining 20 or on prolongations of ring 3 and are therefore loaded above bearing 27 by elastic element 28, for example a screw spring or the like which is connected on ring 3 or a part connected to it such that its free end with V-shaped recess 26 is swivelled radially to the inside. When wafer-shaped article 7 is inserted into the basket retaining fingers 4 swivel around their bearings 27, their free ends moving to the outside in the direction of arrow 25 so that the wafer-shaped article is then securely held by retaining fingers 4 under the action of tension springs 28.

Figure 5:
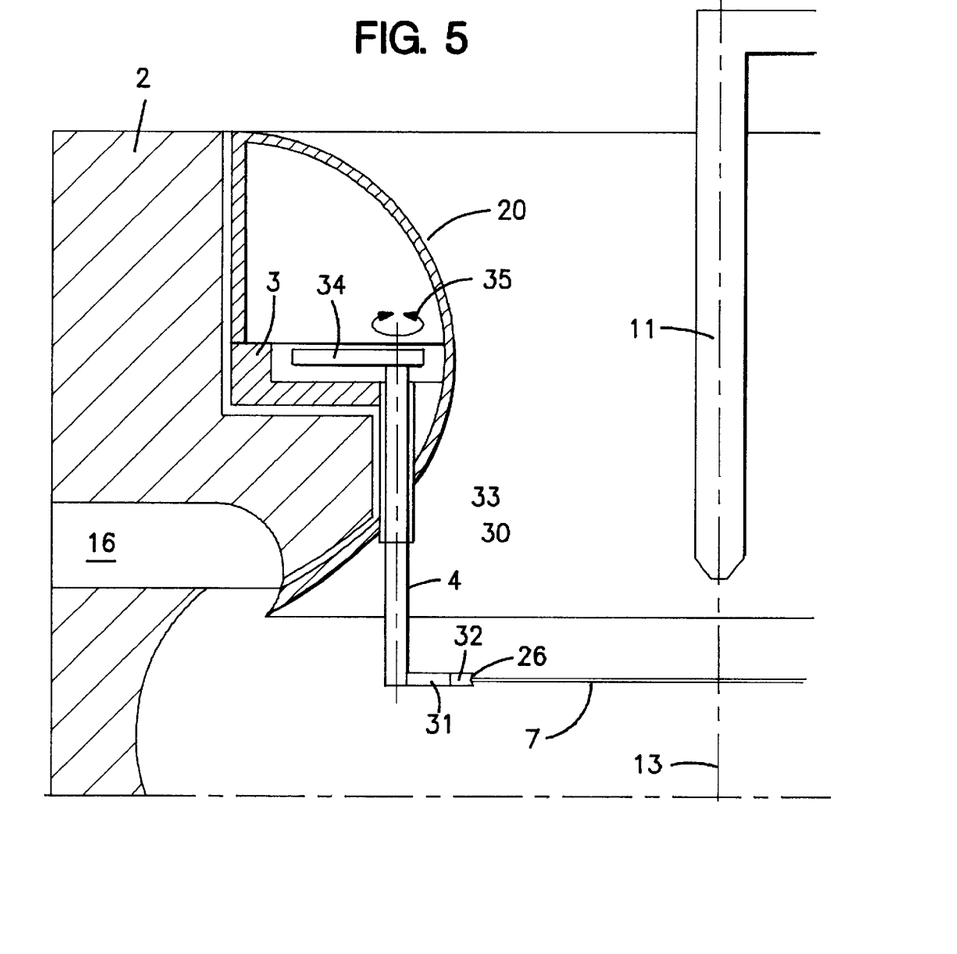
FIG. 5 shows one embodiment with rotary retaining finger.
Figure 5A:
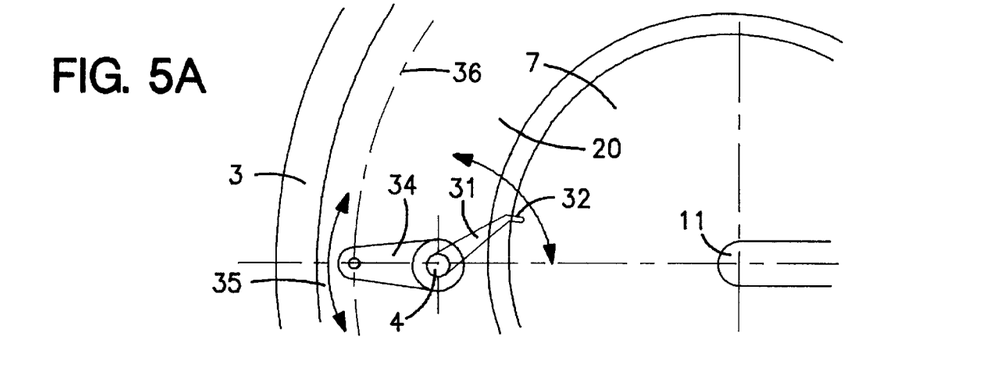
FIG. 5a shows the embodiment of FIG. 5 in an overhead view.

In the embodiment shown in FIG. 5 and 5a, retaining fingers 4 are mounted to swivel around axes 30 which are aligned preferably parallel to axis 13 around which ring 3 can turn, in sleeves 33 which are joined to ring 3. Retaining fingers 4 on their lower ends carry arms 31 with free ends 32 which are provided with V-shaped recesses 26 into which wafer-shaped article 7 fits with its outer edge. To swivel arms 31 of retaining fingers 4 around axis 30 in the direction of double arrow 35, on the end of retaining fingers 4 which lies within cover 20 provided space, there are connecting rods 34 which are joined to retaining fingers 4 and to which is assigned a drive device which is common for example to all retaining fingers 4. FIG. 5a shows in an overhead view how the retaining fingers 4 are formed according to FIG. 5 once again and also common actuating element 36.

Figure 6:
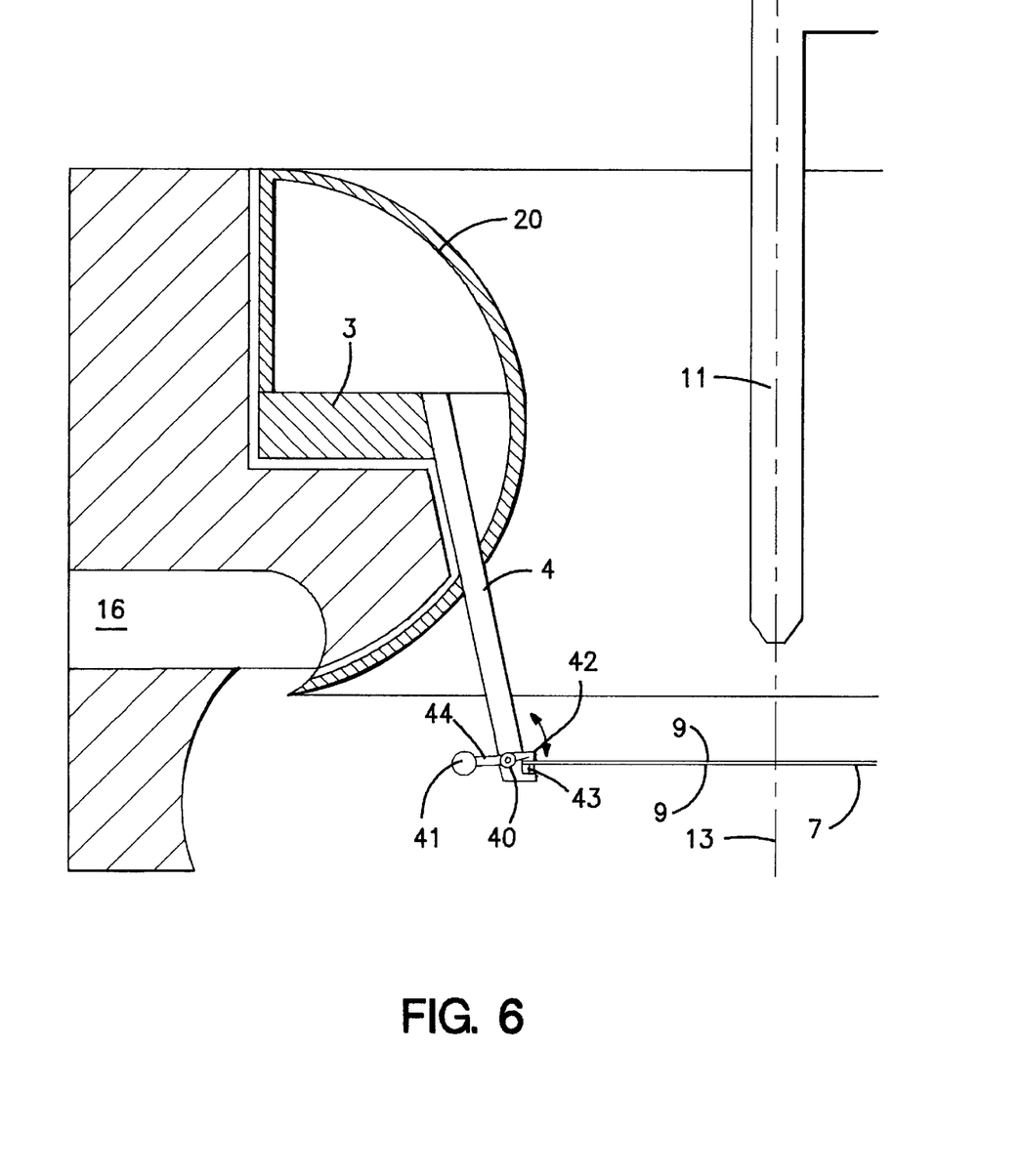
FIG. 6 shows an embodiment with retaining fingers with mechanical interlock.

In the embodiment of retaining fingers 4 shown in FIG. 6, in the region of the free end of retaining fingers 4 there are hold-downs 42 which are made hook-shaped, for example, which can swivel around axes 40, and which can line up from overhead against wafer-shaped article 7 which lies on support fingers (pins) 43 when the device is in operation, i.e., when ring 3 is turning. When ring 3 is turning, hold-downs 42 are pressed down by weight 41 which is rigidly joined to it via lever arm 44 against top 9 of article 7 so that wafer-shaped article 7 is squeezed between pins 43 and hold-downs 42.

Figure 7:
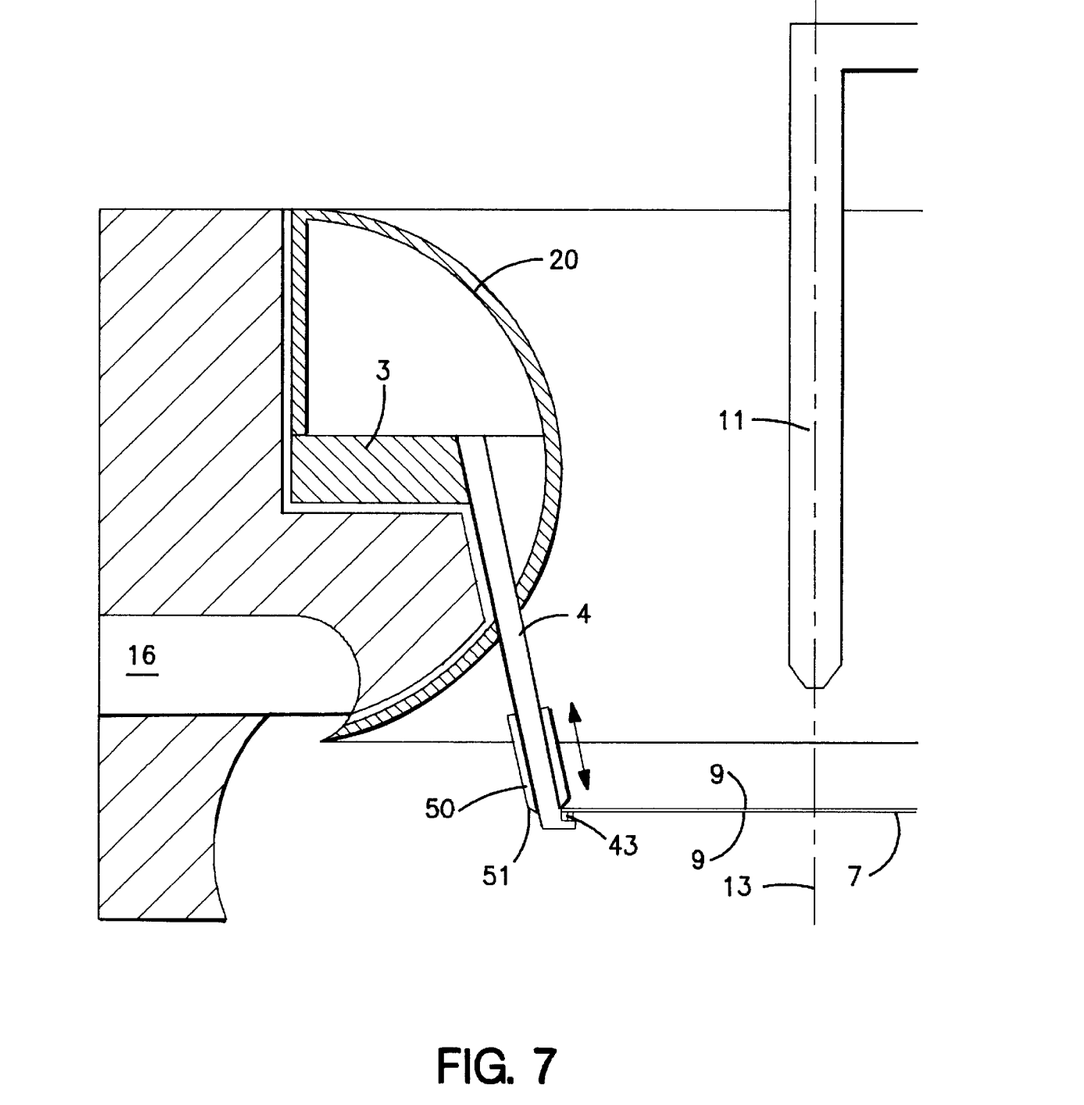
FIG. 7 shows another embodiment of a retaining finger with mechanical interlock.

In the embodiment shown in FIG. 7, on retaining fingers 4 there are sleeves 50 which can move in their longitudinal direction and which rest with their lower end surfaces 51 against upper surface 9 of wafer-shaped article 7 so that it is held against pins 43 on the free end of retaining fingers 4. Face 51 of sleeves 50 can have the shape of the jacket of a truncated cone so that sleeve 50 adjoins exclusively the outermost edge of wafer-shaped article 7.

In summary the invention can be described for example as follows:

In chamber 1 a basket which is formed by ring 3 and retaining fingers 4 is pivotally mounted. By turning the basket wafer-shaped article 7 which is held by retaining fingers 4 at an axial distance from ring 3 is caused to rotate. Nozzle 10 and 11 is assigned to both upper and also lower large surface 9 of article 7 and from it a treatment fluid can be applied to article 7.

I claim:

1. Device for treatment of wafer-shaped articles having opposite planar surfaces, located in a chamber, with treatment fluid, comprising:

a rotary mounting attached to said chamber interior for supporting a said wafer-shaped article;

a first nozzle positioned in proximity to said rotary mounting to permit unobstructed application of said treatment fluid to said wafer-shaped article; and a second nozzle positioned in proximity to said rotary mounting to permit unobstructed application of said treatment fluid to said wafer-shaped article and positioned generally opposing said first nozzle, wherein said first nozzle unobstructedly applies said treatment fluid to a first surface of said wafer-shaped article and said second nozzle unobstructedly applies treatment fluid to a second surface of said wafer-shaped article;

said rotary mounting comprising a ring pivotally mounted in said chamber to permit rotational displacement in a plane of said wafer-shaped article, and plural retaining fingers operatively attached to said ring, said fingers adjoining an outer periphery of said wafer-shaped article in a plane distant from a plane of said ring.

2. Device according to claim 1, wherein said retaining fingers elastically adjoin said outer periphery of said wafer-shaped article.

3. Device according to claim 2, wherein said retaining fingers are spring-elastic.

4. Device according to claim 2, wherein one of said retaining fingers is swivel-mounted in said ring and is under the action of a tension spring which radially loads an end of said one retaining finger.

5. Device according to claim 4, wherein said tension spring comprises a first spring end attached to an end of said one retaining finger opposite a free end of said one retaining finger adjoining said wafer-shaped article and a second spring end attached to said ring.

6. Device according to claim 1, wherein said retaining fingers further comprise ends which engage the outer periphery of wafer-shaped article, and said retaining fingers are angled.

7. Device according to claim 1, wherein ends of said retaining fingers adjoin said wafer-shaped article and comprise a recess into which the outer peripheral edge of said wafer-shaped article fits.

8. Device according to claim 1, wherein said retaining fingers project downward from said ring.

9. Device according to claim 1, wherein said retaining fingers project upward from ring.

10. Device according to claim 1, wherein said rotational displacement of said ring describes an axis of ring rotation, and wherein said first nozzle further comprises a swivel mounting wherein said first nozzle is adjustable in a manner describing an arc from said axis of ring rotation extending to opposing peripheral edges of said wafer-shaped article.

11. Device according to claim 10, wherein said swivel mounting further comprises a swivel axis aligned parallel and distant to said axis of ring rotation.

12. Device according to claim 11, wherein said swivel axis is located outside of said ring.

13. Device according to claim 1, wherein said first nozzle and said second nozzle are adjustable along one diameter of said wafer-shaped article.

14. Device for treatment of wafer-shaped articles, located in a chamber, with treatment fluid, comprising:

a rotary mounting attached to said chamber interior for supporting a said wafer-shaped article;

a first nozzle positioned in proximity to said rotary mounting to permit unobstructed application of said treatment fluid to said wafer-shaped article;

said rotary mounting comprising a ring pivotally mounted in said chamber to permit rotational displacement in a plane of said wafer-shaped article, plural retaining fingers operatively attached to said ring, said fingers adjoining an outer periphery of said wafer-shaped article at a plane distant from a plane of said ring; and a cover radially surrounding an interior of said ring.

15. Device according to claim 14, wherein said cover is a body of revolution which flares both to a top and a bottom from a center area.

16. Device according to claim 15, further comprising a suction channel penetrating said chamber.

17. Device according to claim 16, wherein said suction channel leads through said chamber.

18. Device according to claim 16, wherein said suction channel is higher, when the device is in its position of use, than said bottom of said cover.

19. Device according to claim 15, wherein said bottom of said cover is higher, when the device is in its position of uses than said wafer-shaped article.

20. Device according to claim 1, wherein said retaining fingers comprise free ends, each free end having a V-shaped recess for receiving said outer periphery.

21. Device according to claim 1, wherein said rotational displacement of said ring describes an axis of ring rotation, and wherein a line extending from said retaining fingers forms an acute angle with said axis of ring rotation.

22. Device according to claim 1, wherein said retaining fingers are swivel supported by said ring around longitudinal axes and wherein said retaining fingers further comprise lower ends arms with free ends, said free ends adjoining said outer periphery of said wafer-shaped article.

23. Device according to claim 22, wherein said free ends have a recess open to adjoin said outer periphery.

24. Device according to claim 22, wherein said retaining fingers are guided in a sleeve attached to said ring.

25. Device according to claim 22, wherein each of said retaining fingers is joined on an upper end to a connecting rod connected to a drive device for swivelling of said each retaining finger.

26. Device according to claim 22, wherein each of said longitudinal axes of said retaining fingers is aligned parallel to an axis of rotation of said ring.

27. Device according to claim 1, wherein one of said retaining fingers further comprises a pin contacting the bottom surface of the wafer-shaped article and a swivelling hold-down contacting the top surface of said wafer-shaped article.

28. Device according to claim 27, wherein said swivelling hold-down is swivel-mounted.

29. Device according to claim 27, wherein said swivelling hold-down further comprises a weight joined to said swivelling hold-down via a lever.

30. Device according to claim 1, wherein said retaining finger comprises a movable sleeve contacting said top surface and a support contacting said bottom surface of said wafer-shaped article.

31. Device according to claim 30, wherein the support is a pin.

32. Device according to claim 30, wherein said movable sleeve comprises a face adjoining said wafer-shaped article, said face having the shape of the jacket of a truncated cone.

* * * * *